(12) United States Patent
Suzuki et al.

(10) Patent No.: US 10,896,891 B2
(45) Date of Patent: Jan. 19, 2021

(54) SEMICONDUCTOR DEVICE

(71) Applicant: TOSHIBA MEMORY CORPORATION, Minato-ku (JP)

(72) Inventors: Yu Suzuki, Yokohama (JP); Shoko Kikuchi, Kawasaki (JP); Merii Inaba, Kamakura (JP); Jun Murakami, Yokohama (JP); Takashi Shigeoka, Fujisawa (JP); Hiroshi Inagaki, Chigasaki (JP); Takashi Okuhata, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/354,894

(22) Filed: Mar. 15, 2019

(65) Prior Publication Data
US 2020/0083192 A1    Mar. 12, 2020

(30) Foreign Application Priority Data

Sep. 10, 2018 (JP) ................................. 2018-168455

(51) Int. Cl.
*H01L 23/00* (2006.01)
*H01L 25/18* (2006.01)

(52) U.S. Cl.
CPC .............. *H01L 24/49* (2013.01); *H01L 24/09* (2013.01); *H01L 25/18* (2013.01); *H01L 2224/49107* (2013.01); *H01L 2224/49174* (2013.01); *H01L 2924/1434* (2013.01)

(58) Field of Classification Search
CPC .................... H01L 24/49; H01L 24/09; H01L 2224/49107; H01L 2224/49174; H01L 2224/1434; H01L 25/18
See application file for complete search history.

(56) References Cited

U.S. PATENT DOCUMENTS

| | | |
|---|---|---|
| 2007/0285860 A1 | 12/2007 | Shintani et al. |
| 2008/0211548 A1 | 9/2008 | Hayashi et al. |
| 2013/0122672 A1* | 5/2013 | Or-Bach ............... H01L 21/845 438/199 |
| 2016/0268304 A1 | 9/2016 | Ikeda et al. |
| 2017/0345814 A1 | 11/2017 | Wakui et al. |

FOREIGN PATENT DOCUMENTS

JP     2016-171243     9/2016

* cited by examiner

*Primary Examiner* — Timor Karimy
(74) *Attorney, Agent, or Firm* — Oblon, McClelland, Maier & Neustadt, L.L.P.

(57) ABSTRACT

A semiconductor device includes: a semiconductor substrate; a plurality of first pad electrodes provided above the semiconductor substrate; a plurality of first wires electrically connected to the plurality of first pad electrodes respectively; a first electrode commonly connected to the plurality of first wires; a second pad electrode provided above the semiconductor substrate; and a first resistance portion and a first protective element that are connected in series between the first electrode and the second pad electrode.

20 Claims, 20 Drawing Sheets

SEMICONDUCTOR DEVICE

CROSS-REFERENCE TO RELATED APPLICATIONS

This application is based upon and claims the benefit of Japanese Patent Application No. 2018-168455, filed on Sep. 10, 2018, the entire contents of which are incorporated herein by reference.

BACKGROUND

Field

Embodiments described below relate to a semiconductor device.

Description of the Related Art

A semiconductor device that operates at a high speed is desired.

DETAILED DESCRIPTION

A semiconductor device includes: a semiconductor substrate; a plurality of first pad electrodes provided above the semiconductor substrate; a plurality of first wires electrically connected to the plurality of first pad electrodes respectively; a first electrode commonly connected to the plurality of first wires; a second pad electrode provided above the semiconductor substrate; and a first resistance portion and a first protective element that are connected in series between the first electrode and the second pad electrode.

Next, semiconductor devices according to embodiments are described in detail with reference to the drawings. Incidentally, the following embodiments are only examples, and are not intended to limit the scope of the present invention.

In addition, in the present specification, meanings of expressions such as "upward"/"downward," "upper"/"lower," "above"/"below," and the similar expressions are defined with reference to the substrate. For example, when a direction intersecting with the surface of the substrate is defined as a first direction, a direction away from the substrate along the first direction is referred to as an upward direction, and a direction approaching the substrate is referred to as a downward direction. Moreover, when a lower surface and a lower end of a certain configuration are referred to, they are respectively assumed to mean a surface and an end of the configuration on the closer side with respect to the substrate, and when an upper surface and an upper end of a certain configuration are referred to, they are respectively assumed to mean a surface and an end of the configuration on the farther side with respect to the substrate. In addition, when a direction intersecting with the first direction is defined as a second direction, a surface intersecting with the second direction is referred to as a side surface, for example.

First Embodiment

[Entire Configuration]

Figure 1:
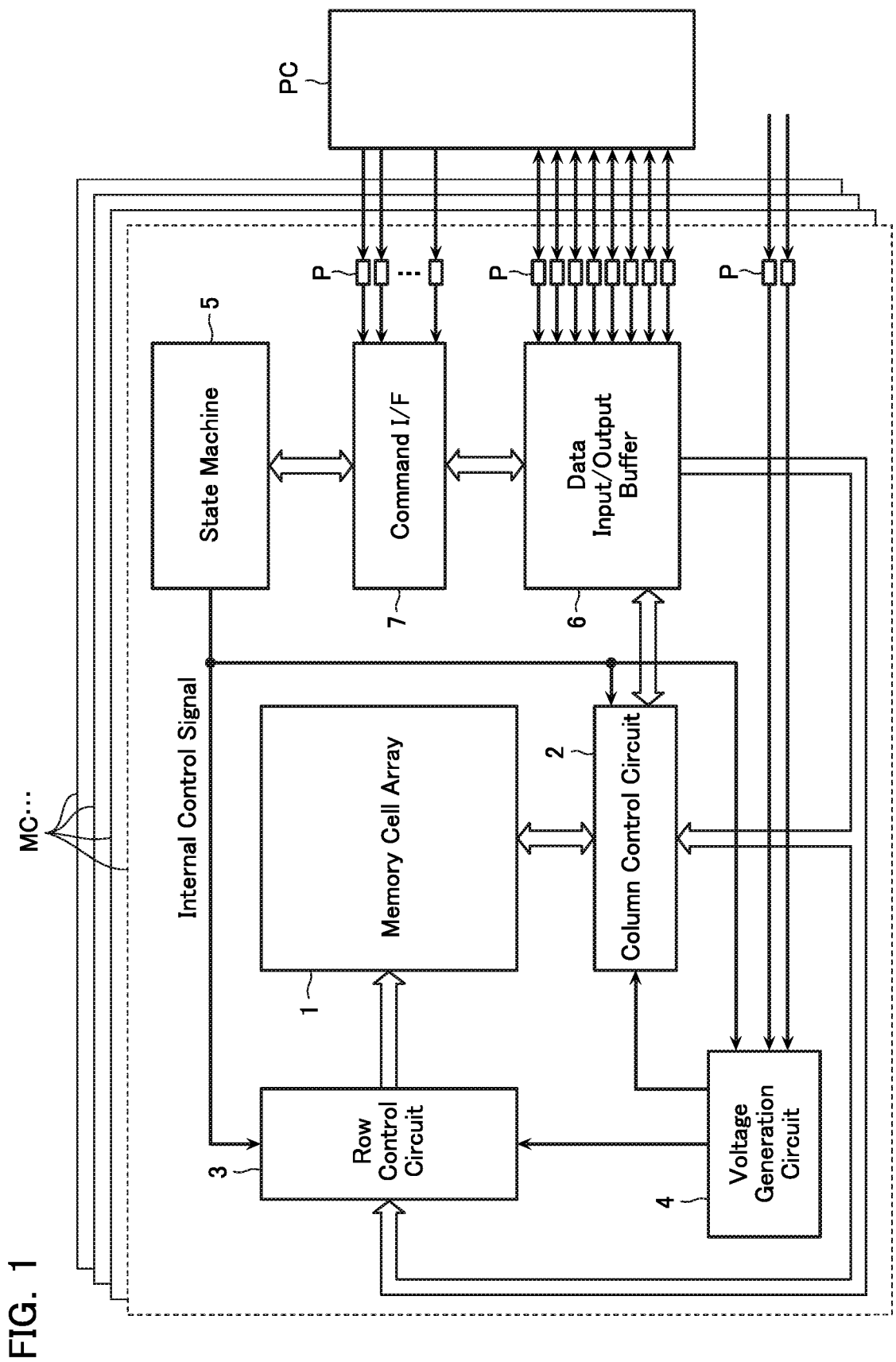
FIG. 1 is a schematic block diagram of a semiconductor device according to a first embodiment.

FIG. 1 is a schematic block diagram of a semiconductor device according to a first embodiment. A part of the configuration is omitted in FIG. 1, for the convenience of explanation.

The semiconductor device according to the first embodiment includes: a plurality of memory chips MCs; and a processor chip PC that transmits and receives data (user data, address data, command data and the like), to and from the memory chips MCs. Each of the memory chips MCs has a plurality of pad electrodes P. The memory chip MC transmits and receives data to and from the processor chip PC via the plurality of pad electrodes P.

The memory chip MC includes a memory cell array 1, and a peripheral circuit that controls the memory cell array 1. The peripheral circuit includes a column control circuit 2, a row control circuit 3, a voltage generation circuit 4, a state machine 5, a data input/output buffer 6, and a command interface 7.

The memory cell array 1 includes a plurality of memory cells that store user data, and bit lines and word lines that are connected to the plurality of memory cells.

The column control circuit 2 reads the user data via the bit lines and transmits the data to a data register, or transfers a voltage to the bit lines according to the user data which the column control circuit 2 has received from the data register.

The row control circuit 3 transfers a predetermined voltage to the word lines according to address data which the row control circuit has received from an address register.

The voltage generation circuit 4 raises or lowers a voltage supplied via a pad electrode P, and transfers the output voltage to the column control circuit 2 and the row control circuit 3.

The state machine 5 sequentially decodes command data which the state machine has received from a command register, and transmits internal control signals to the column control circuit 2, the row control circuit 3 and the voltage generation circuit 4.

The data input/output buffer 6 receives data of a plurality of bits in parallel via a plurality of pad electrodes P, and transfers the data to a register. In addition, the data input/output buffer 6 outputs data of a plurality of bits in the register in parallel via a plurality of pad electrodes P, and transmits the data to the processor chip PC.

The command interface 7 receives an external control signal via a pad electrode P, and controls the data input/output buffer 6 according to the external control signal.

Figure 2:
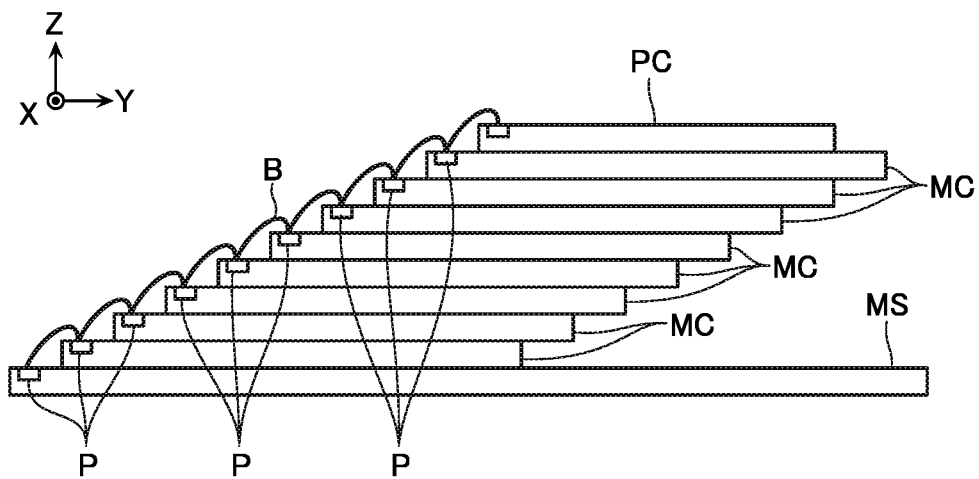
FIG. 2 is a schematic side view of the same semiconductor device.
Figure 3:
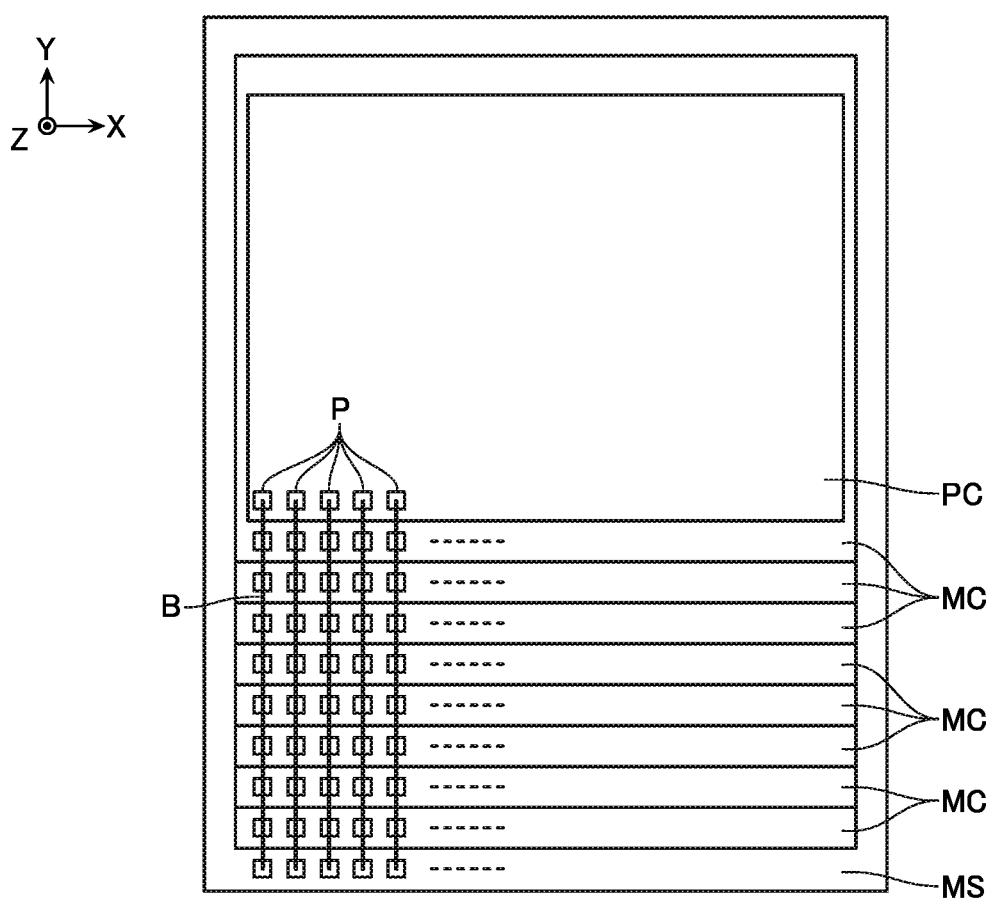
FIG. 3 is a schematic plan view of the same semiconductor device.

FIG. 2 is a schematic side view showing a configuration example of the semiconductor device according to the present embodiment. FIG. 3 is a schematic plan view showing the same configuration example. Apart of the configuration is omitted in FIGS. 2 and 3, for the convenience of explanation.

As shown in FIG. 2, the semiconductor device according to the present embodiment includes: a mounting substrate MS; a plurality of memory chips MCs that are stacked on the mounting substrate MS; and a processor chip PC that is stacked on the memory chip MCs. These configurations are stacked so as to be displaced in the Y direction in such a way that the pad electrodes P formed on the upper surface are each exposed to the outside, and are connected to each other via an adhesive or the like.

As shown in FIG. 3, the mounting substrate MS, each of the plurality of memory chips MCs and the processor chip PC are provided with a plurality of pad electrodes P. The plurality of pad electrodes P provided on the mounting substrate MS, on each of the plurality of memory chips MCs and on the processor chip PC are connected to each other via bonding wires B.

[Protective Circuit]

When there is a large difference between the amount of electric charge accumulated in the memory chip MC and the amount of electric charge accumulated in a test device or the like, an electro-static discharge (ESD) occurs, and a large current sometimes results in flowing into the pad electrode P. The electro-static discharge includes, for example, a charged device model (CDM), a machine model (MM) and a human body model (HBM).

The semiconductor device according to the present embodiment has a protective circuit so that the internal circuit (memory cell array 1 in FIG. 1, for example) of the semiconductor device is not damaged by such an electro-static discharge.

Figure 4:
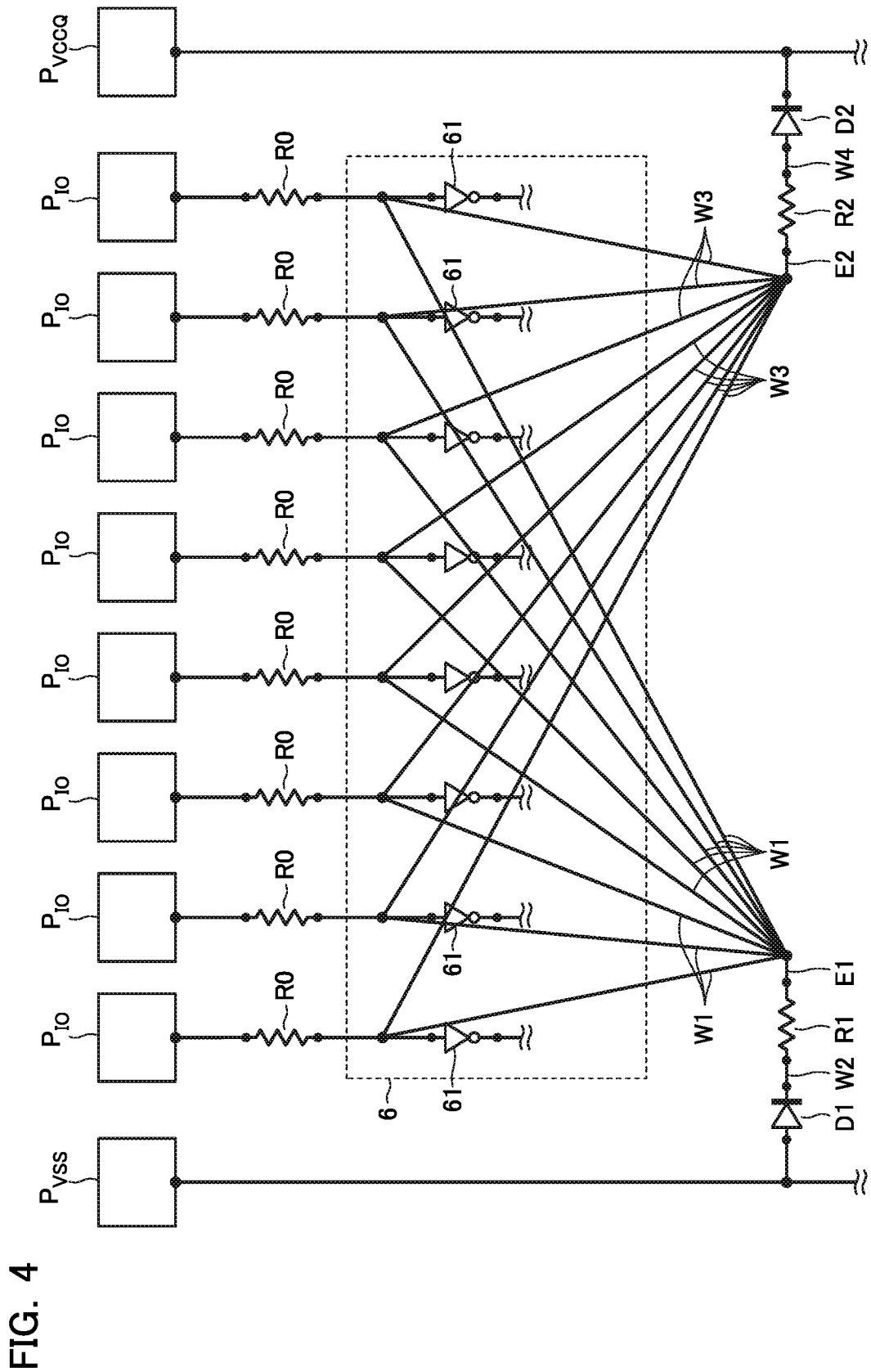
FIG. 4 is a schematic circuit diagram of a protective circuit according to the first embodiment.

FIG. 4 is a schematic circuit diagram of a configuration of the protective circuit according to the present embodiment. In FIG. 4, a part of the configuration is omitted.

The protective circuit according to the present embodiment includes: a plurality of pad electrodes $P_{IO}$; a plurality of wires W1 that are connected to the plurality of pad electrodes $P_{IO}$, respectively; a common electrode E1 that is connected to the plurality of wires W1 in common; a resistance portion R1 that is connected to the common electrode E1; a protective element D1 that is connected to the resistance portion R1 via a wire W2; and a pad electrode $P_{VSS}$ that is connected to the protective element D1. The protective circuit also includes: a plurality of wires W3 that are connected to the plurality of pad electrodes $P_{IO}$, respectively; a common electrode E2 that is connected to the plurality of wires W3 in common; a resistance portion R2 that is connected to the common electrode E2; a protective element D2 that is connected to the resistance portion R2 via a wire W4; and a pad electrode $P_{VCCQ}$ that is connected to the protective element D2.

The pad electrode $P_{IO}$ is a pad electrode P that is used for transmitting/receiving data. The pad electrodes $P_{IO}$ are connected to inverters 61 inside the data input/output buffer 6, respectively. The pad electrodes $P_{VSS}$ and $P_{VCCQ}$ are pad electrodes P that are used for supplying voltage. A voltage $V_{SS}$ (approximately 0.0 V, for example) is supplied to the pad electrode $P_{VSS}$. A voltage $V_{CCQ}$ larger than the voltage $V_{SS}$ (approximately 1.8 V, for example) is supplied to the pad electrode $P_{VCCQ}$.

Impedances of the plurality of wires W1 are substantially the same. In addition, impedances of the plurality of wires W2 are also substantially the same. For example, when the impedances of the plurality of wires W1 are the same by two significant digits, the impedances are sufficiently substantially the same. Incidentally, R0 in the figure schematically shows that each of the wires connected to the plurality of pad electrodes $P_{IO}$ has an internal resistance.

The protective elements D1 and D2 are each, for example, a nonlinear element such as a diode. A direction in which the protective element D1 rectifies is set at a direction in which an electric current flows from the pad electrode $P_{VSS}$ to the pad electrode $P_{IO}$. A direction in which the protective element D2 rectifies is set at a direction in which an electric current flows from the pad electrode $P_{IO}$ to the pad electrode $PV_{CCQ}$.

Next, an operation of the protective circuit will be subsequently described with reference to FIG. 4.

When the memory chip MC transmits and receives data, a voltage corresponding to data "0" or a voltage corresponding to data "1" is supplied to the plurality of pad electrodes $P_{IO}$. The levels of these voltages are set, for example, within a range larger than or equal to the voltage $V_{SS}$ and smaller than or equal to the voltage $V_{CCQ}$. Thereby, the inverters 61 in the data input/output buffer 6 are driven, and data is input.

Incidentally, in this case, basically, reverse voltages are applied to the protective elements D1 and D2. Therefore, an electric current does not flow in the protective elements D1 and D2. In addition, the impedances in the wires W1 and W3 are sufficiently larger than impedances in wires between the pad electrodes $P_{IO}$ and the respective inverters 61.

When the above described electro-static discharge has occurred, an electric current flows in each of the protective elements D1 and D2. In addition, because of the electric current, the resistance portions R1 and R2 are broken. Thereby, the common electrodes E1 and E2 are electrically disconnected from the protective elements D1 and D2, respectively.

Comparative Example

Figure 5:
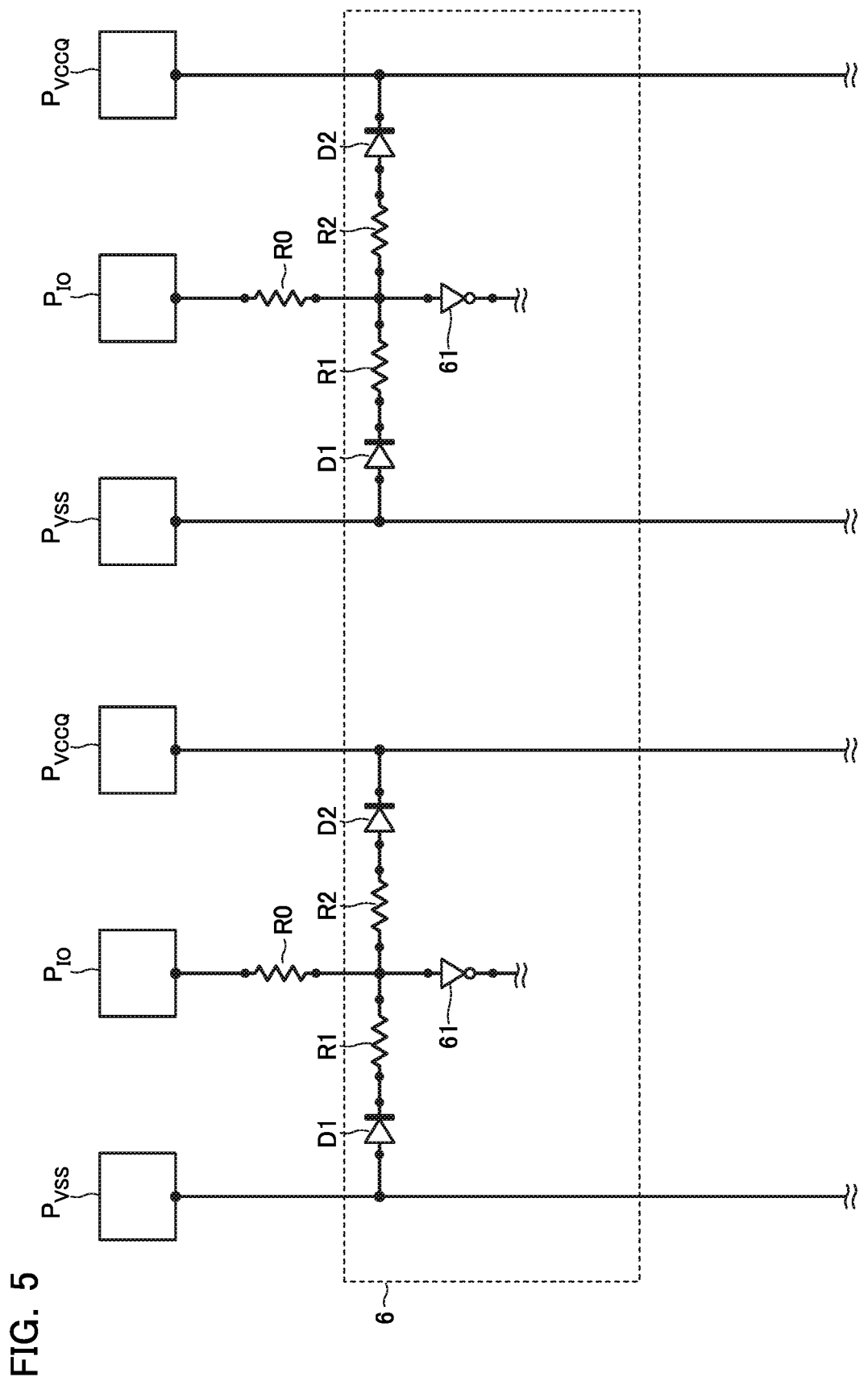
FIG. 5 is a schematic circuit diagram of a protective circuit according to a comparative example.

FIG. 5 is a schematic circuit diagram of a configuration of a protective circuit according to a comparative example. In FIG. 5, a part of the configuration is omitted.

The protective circuit according to the comparative example includes: a plurality of pad electrodes $P_{IO}$ a plurality of resistance portions R1 that are connected to the plurality of pad electrodes $P_{IO}$, respectively; a plurality of protective elements D1 that are connected to the plurality of resistance portions R1, respectively; and a plurality of pad electrodes $P_{VSS}$ that are connected to the plurality of protective elements D1, respectively. The protective circuit also includes: a plurality of resistance portions R2 that are connected to the plurality of pad electrodes $P_{IO}$, respectively; a plurality of protective elements D2 that are connected to the plurality of resistance portions R2, respectively; and a plurality of pad electrodes $P_{VCCQ}$ that are connected to the plurality of protective elements D2, respectively.

When the above described electro-static discharge has occurred in such a structure, one or more resistance portions R1 and R2 are broken, and the pad electrodes $P_{IO}$ corresponding to those resistance portions are electrically disconnected from the protective elements D1 and D2.

Effects of First Embodiment

Figure 6:
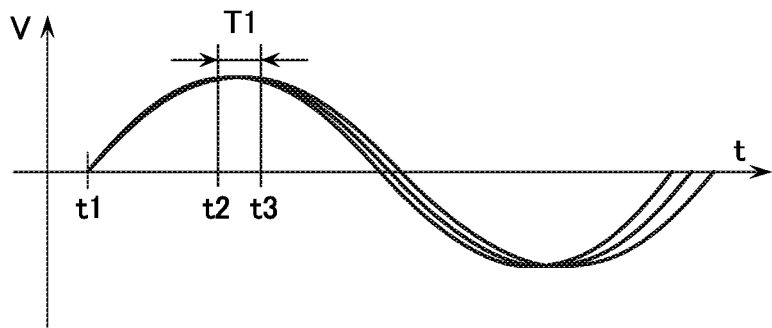
FIG. 6 is a schematic diagram of waveforms which show signals in a protective circuit.
Figure 7:
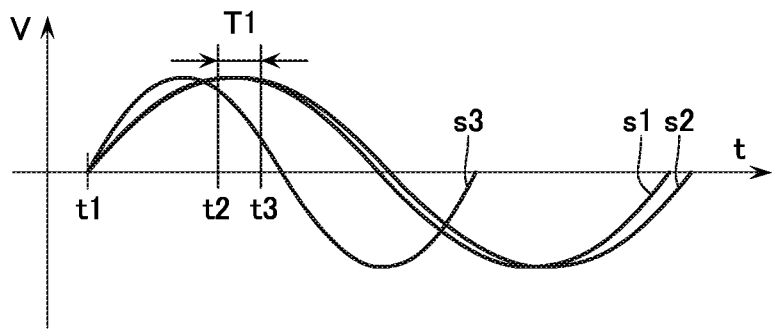
FIG. 7 is a schematic diagram of waveforms which show signals in a protective circuit.
Figure 8:
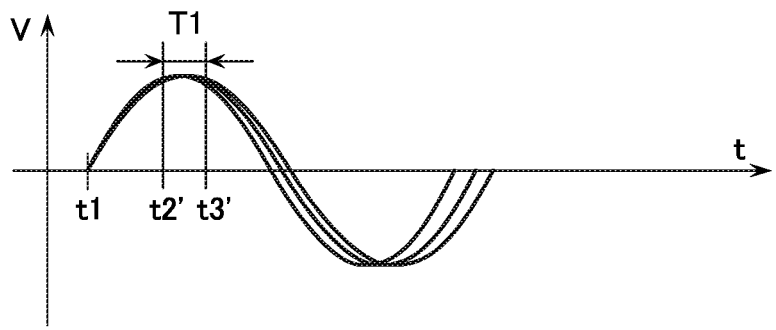
FIG. 8 is a schematic diagram of waveforms which show signals in a protective circuit.

FIG. 6 to FIG. 8 are schematic diagrams of waveforms which show signal waveforms of the plurality of pad electrodes $P_{IO}$. The horizontal axis shows time t, and the vertical axis shows a magnitude of voltage V. Incidentally, FIG. 6 to FIG. 8 show examples in which data of "0" or "1" has been input into all of the plurality of pad electrodes $P_{IO}$.

FIG. 6 shows signal waveforms in the case where the resistance portions R1 and R2 are not broken, in the semiconductor device according to the first embodiment or the comparative example. As shown in FIG. 6, when a signal is input into the pad electrode $P_{IO}$ at timing t1, timing at which peaks of voltage of the plurality of pad electrodes $P_{IO}$ appear are in a period T1 which is shown by a period between timings t2 and t3. In the period T1, data is acquired by the data input/output buffer 6.

FIG. 7 shows signal waveforms in the case where any one of the resistance portions R1 and R2 has been broken in the semiconductor device according to the comparative example. Signals s1 and s2 show signals of the pad electrodes $P_{IO}$ that are connected to the resistance portion R1 or R2 that is not broken. A signal s3 is a signal of the pad electrode $P_{IO}$ that is connected to the resistance portion R1 or R2 that is broken.

In the illustrated example, the signals s1 and s2 reach the maximal values in the period T1. Therefore, the data corresponding to the signals s1 and s2 are normally acquired.

On the other hand, the pad electrode $P_{IO}$ corresponding to the signal s3 is electrically disconnected from the protective elements D1 or D2, and accordingly has a smaller capacitance than each of the pad electrodes $P_{IO}$ corresponding to the signals s1 and s2, by the amounts of capacitances of the protective elements D1 or D2 (refer to FIG. 5). Therefore, the timing at which the signal s3 forms the peak sometimes differ from the period T1 in which the signals s1 and s2 form the peaks. In such a case, the data corresponding to the signal s3 is sometimes not normally acquired.

FIG. 8 shows signal waveforms in the case where any one of the resistance portions R1 and R2 has been broken, in the protective circuit according to the first embodiment.

In the protective circuit according to the first embodiment, if the resistance portion R1 or R2 is broken, the common electrodes E1 or E2 is electrically disconnected from the protective elements D1 or D2 (refer to FIG. 4). The common electrodes E1 and E2 are connected to the plurality of pad electrodes $P_{IO}$ in common. Therefore, when the common electrodes E1 and E2 are electrically disconnected from the protective elements D1 and D2, the capacitances of the plurality of pad electrodes $P_{IO}$ change substantially uniformly. Therefore, if the timing t2' of starting the acquisition of data and the timing t3' of finishing the acquisition of data is adjusted, and the data is acquired in the period of T1, the data of all the signals can be normally acquired. Thereby, the semiconductor device can be provided that preferably operates.

CONFIGURATION EXAMPLES

The semiconductor device according to the present embodiment can be achieved by various forms. Configuration examples of the semiconductor device according to the present embodiment will be described below, with reference to FIG. 9 to FIG. 22.

First Configuration Example

Figure 9:
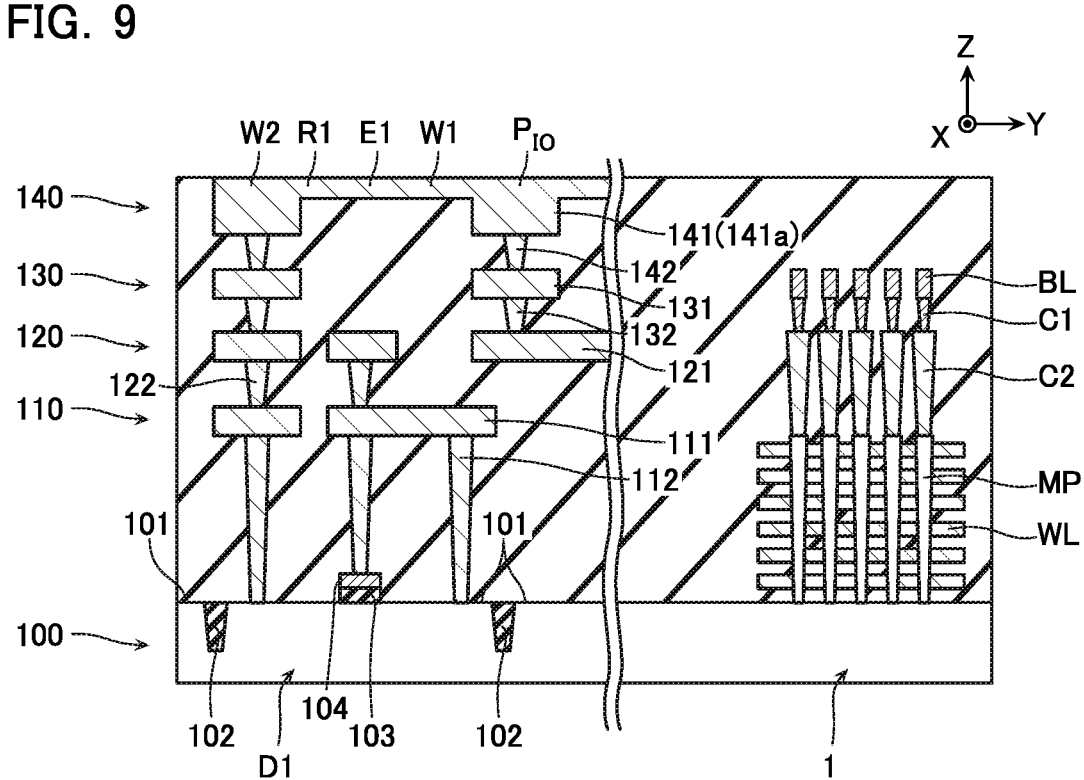
FIG. 9 is a schematic sectional view of a semiconductor device according to a first configuration example.

FIG. 9 is a schematic sectional view for describing a first configuration example. Incidentally, FIG. 9 is a schematic drawing for describing the configuration, and is not the same as a real structure. In FIG. 9, a part of the configuration is omitted.

The semiconductor device according to the first configuration example includes: a semiconductor substrate 100; a memory cell array 1 that is provided on the semiconductor substrate 100; and wiring layers 110, 120, 130 and 140 that are provided above the semiconductor substrate 100.

The memory cell array 1 includes: a plurality of word lines WL that are arranged in the Z direction; a plurality of memory structures MP that penetrate the plurality of word lines WL and extend in the Z direction; bit lines BL that are provided above the memory structures MP; and contact members C1 and C2 that electrically connect the memory structures MP with the bit lines BL. The word line WL is a laminated film of, for example, titanium nitride (TiN) and tungsten (W). The memory structure MP is a substantially columnar structure including a laminated film of, for example, silicon oxide ($SiO_2$), silicon nitride ($Si_3N_4$), silicon oxide and polycrystalline silicon (Si).

The semiconductor substrate 100 is provided with an active area 101, and an insulation area 102 of, for example, silicon oxide ($SiO_2$). The active area 101 is an area that includes impurities such as phosphorus (P) and boron (B), and functions as an N-type semiconductor or a P-type semiconductor. In addition, the semiconductor substrate 100 has a gate insulating film 103 and a gate electrode 104 provided thereon. The gate insulating film 103 is an insulating film of silicon oxide or the like. The gate electrode 104 includes a laminated film of, for example, polycrystalline silicon including impurities such as phosphorus (P), titanium nitride (TiN) and tungsten (W) and the like.

The semiconductor substrate 100 has a plurality of elements provided thereon, such as a field-effect transistor that includes the active area 101, the gate insulating film 103 and the gate electrode 104. These elements function as a part of a complementary MOS (CMOS) circuit which functions as the peripheral circuit. Incidentally, FIG. 9 illustrates the protective element D1. The protective element D1 is a field-effect transistor that includes a part of the active area 101, the gate insulating film 103 and the gate electrode 104. This transistor has the gate electrode 104 that is electrically connected to a drain area, and functions as a nonlinear element having two terminals.

The wiring layers 110, 120, 130 and 140 include a plurality of wiring members 111, 121, 131 and 141, respectively. In addition, contact members 112, 122, 132 and 142 that extend in the Z direction are connected to the lower surfaces of the wiring members 111, 121, 131 and 141, respectively. A lower end of the contact member 112 is connected to the active area 101 or the gate electrode 104. Lower ends of the contact members 122, 132 and 142 are connected to the upper surfaces of the wiring members 111, 121 and 131, respectively. Incidentally, each member in the wiring layers 110 and 120 includes, for example, a laminated film of titanium nitride and tungsten, and the like. In addition, each member in the wiring layer 130 includes, for example, a laminated film of titanium nitride and copper (Cu), and the like. In addition, each member in the wiring layer 130 includes, for example, a laminated film of titanium nitride and aluminum (Al), and the like.

Incidentally, in the illustrated example, a wiring member 141a in the wiring layer 140 functions the pad electrode $P_{IO}$, the wire W1, the common electrode E1, the resistance portion R1, and a part of the wire W2. In addition, the wiring member 141a is connected to a source area (the active area 101) of a protective element D1 via the wiring members 111, 121 and 131, and the contact members 112, 122, 132 and 142. These members provided between the wiring member 141a and the active area 101 function as a part of the wire W2.

Figure 10:
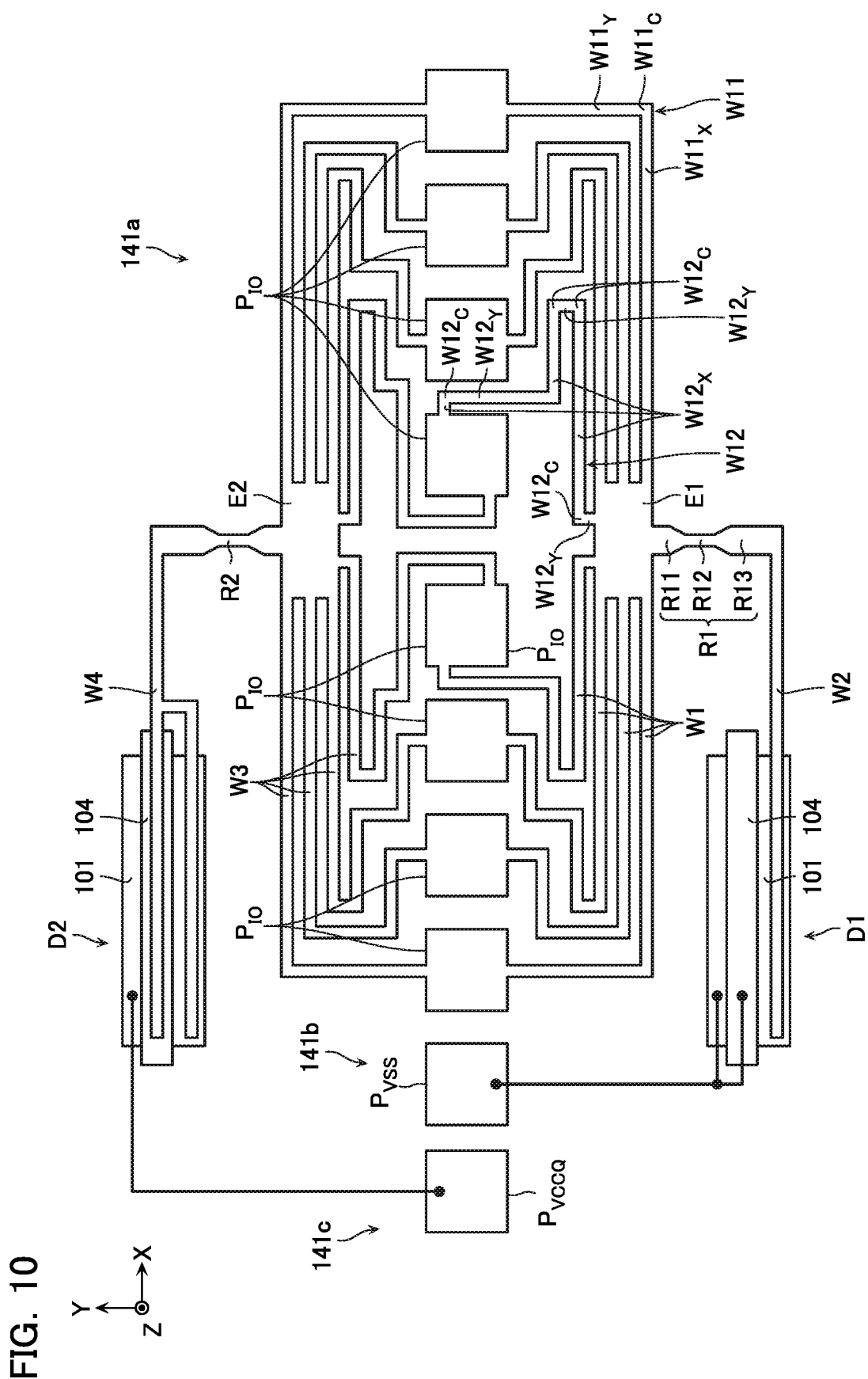
FIG. 10 is a schematic plan view of the same semiconductor device.

FIG. 10 is a schematic plan view showing a configuration example of the semiconductor device. In the illustrated example, the wiring layer 140 includes: the above described wiring member 141a; a wiring member 141b which functions as the pad electrode $P_{VSS}$; and a wiring member 141c which functions as the pad electrode $P_{VCCQ}$.

The wiring member 141a functions as the plurality of pad electrodes $P_{IO}$, the plurality of wires W1 that are connected to the plurality of pad electrodes $P_{IO}$, the common electrode E1 that is connected to the plurality of wires W1 in common, the resistance portion R1 that is connected to the common electrode E1, and the part of the wire W2 that is connected to the resistance portion R1. The wiring member 141a also functions as the plurality of wires W3 that are connected to the plurality of pad electrodes $P_{IO}$, the common electrode E2 that is connected to the plurality of wires W3 in common, the resistance portion R2 that is connected to the common electrode E2, and the part of the wire W4 that is connected to the resistance portion R2.

Incidentally, in the following description, the part which functions as the wire W1 or the like among the wiring members and the contact members is sometimes referred to simply as the "wire W1" or the like.

Wiring widths and wiring lengths of the wires W1 all are substantially the same. That is, a wire W11 connected to a pad electrode $P_{IO}$ of the plurality of pad electrodes $P_{IO}$, the pad electrode $P_{IO}$ being the farthest away from the common electrode E1, includes: one straight portion $W11_Y$ which extends in a Y direction; one straight portion $W11_X$ which extends in an X direction; and one connection portion $W11_C$ which connects the straight portion $W11_Y$ and the straight portion $W11_X$ of which extending directions are different from each other. On the other hand, a wire W12 connected to a pad electrode $P_{IO}$ of the plurality of pad electrodes $P_{IO}$, the pad electrode $P_{IO}$ being closest to the common electrode E1, includes three straight portions $W12_Y$, three straight portions $W12_X$, and five connection portions $W12_C$. Here, suppose, for example, the case where a wiring length of the wire W11 is defined as a first wire length, and a wiring length of the wire W12 is defined as a second wire length.

Then, the first wire length and the second wire length are substantially the same. Incidentally, the first wiring length is a sum of, for example, a length of a straight portion $W11_Y$ in the Y direction and a length of a straight portion $W11_X$ in the X direction. In addition, the second wiring length is a sum of, for example, lengths of each of three straight portions $W12_Y$ in the Y direction, and lengths of each of three straight portions $W12_X$ in the X direction. In addition, for example, in the case where the sum of the wiring lengths are the same by two significant digits, these wiring lengths are sufficiently substantially the same. The plurality of wires W3 are configured almost similarly to the plurality of wires W1. Thereby, the characteristic impedances due to the wires W1 in high-speed signal transmission can be made substantially the same, for all the pad electrodes $P_{IO}$.

The resistance portion R1 includes: a first portion R11 that is connected to the common electrode E1; a second portion R12 that is connected to the first portion R11; and a third portion R13 that is connected to the second portion R12. The wiring width of the second portion R12 is smaller than the wiring width of the first portion R11 and the wiring width of the third portion R13. Incidentally, the third portion R13 is connected to the protective element D1 via the wire W2. The resistance portion R2 is configured almost similarly to the resistance portion R1, and is connected to the protective element D2 via the wire W4.

Here, in the first configuration example, the plurality of pad electrodes $P_{IO}$, the pad electrode $P_{VSS}$ and the pad electrode $P_{VCCQ}$ are arranged in the X direction. Here, as described with reference to FIG. 2, the plurality of memory chips MC are stacked so as to be displaced in the Y direction in such a way that the pad electrodes P formed on the upper surface are each exposed to the outside. Therefore, when the plurality of pad electrodes $P_{IO}$, the pad electrode $P_{VSS}$ and the pad electrode $P_{VCCQ}$ are arranged in the X direction, the plurality of memory chips MC can be stacked without being largely displaced in the Y direction.

Other Configuration Examples

The first configuration example is illustrated only as an example, and a specific configuration can be appropriately varied.

For example, in the first configuration example, only the wiring member 141a in the wiring layer 140 functions as the wires W1 and W3. However, members in other wiring layers 110, 120 and 130 may function as parts of the wires W1 and W3.

Figure 11:
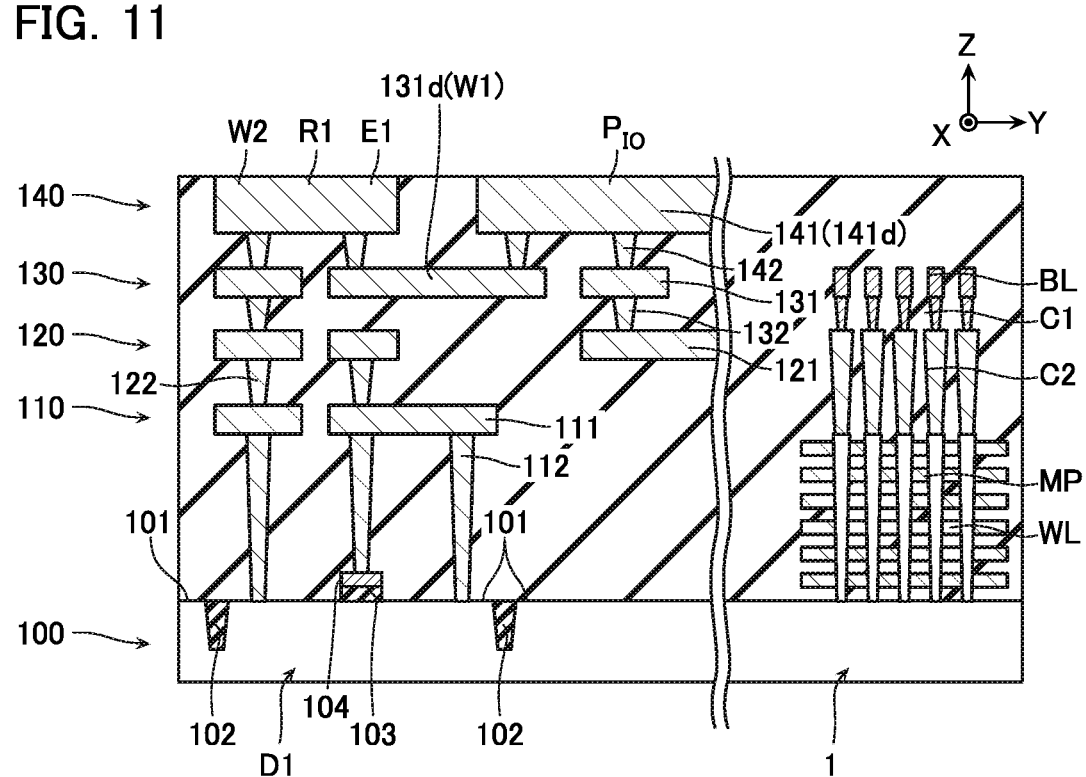
FIG. 11 is a schematic sectional view of a semiconductor device according to a second configuration example.
Figure 12:
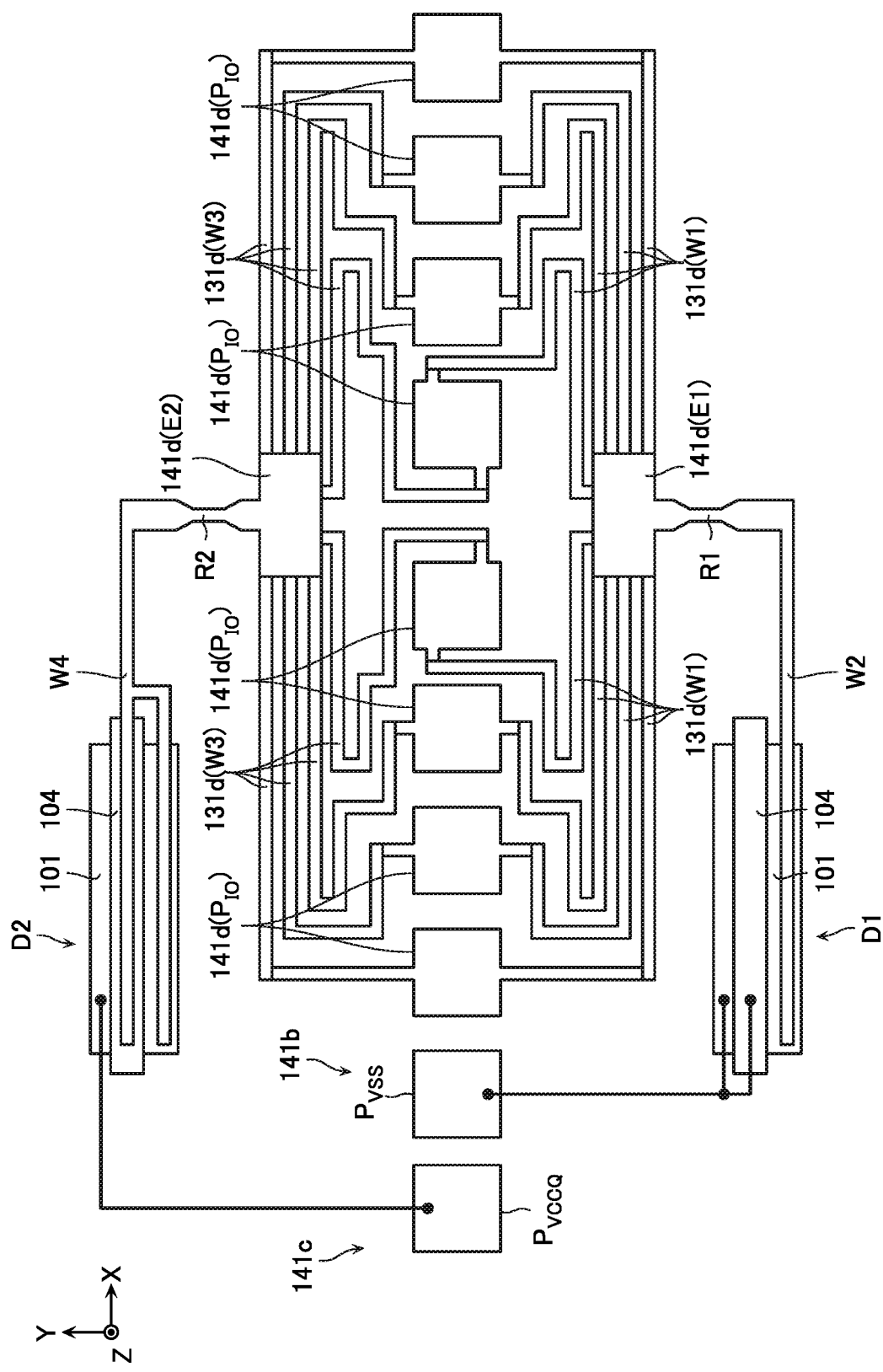
FIG. 12 is a schematic plan view of the same semiconductor device.
Figure 13:
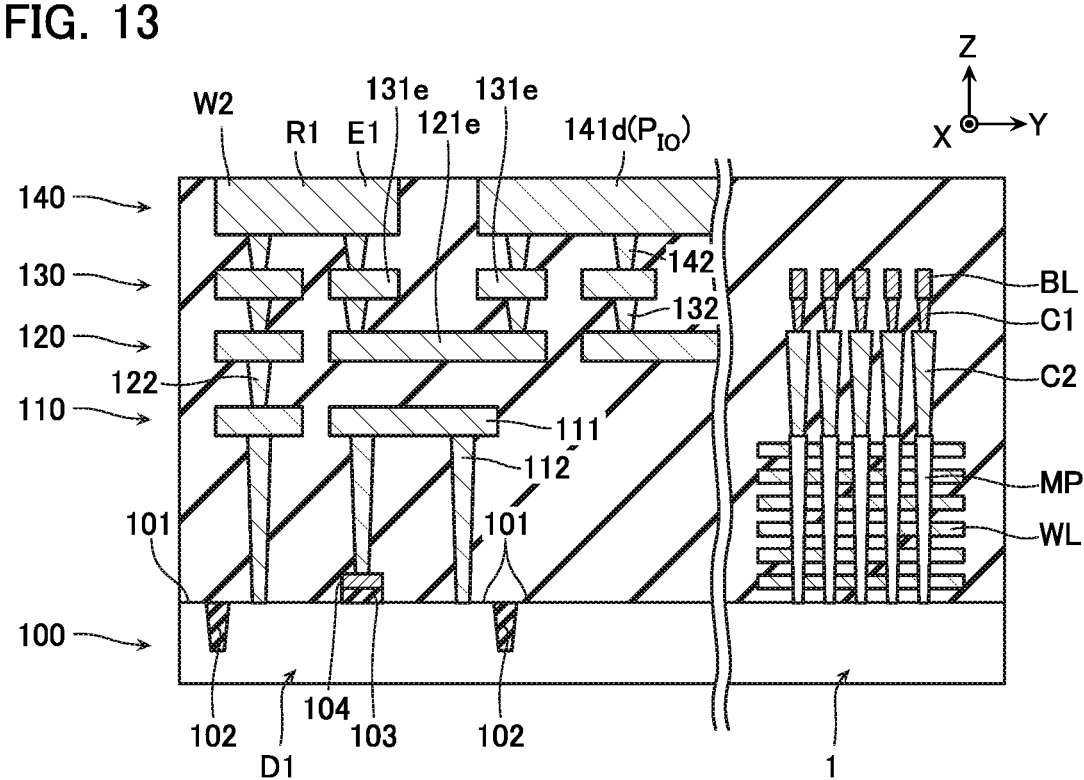
FIG. 13 is a schematic sectional view of a semiconductor device according to a third configuration example.
Figure 14:
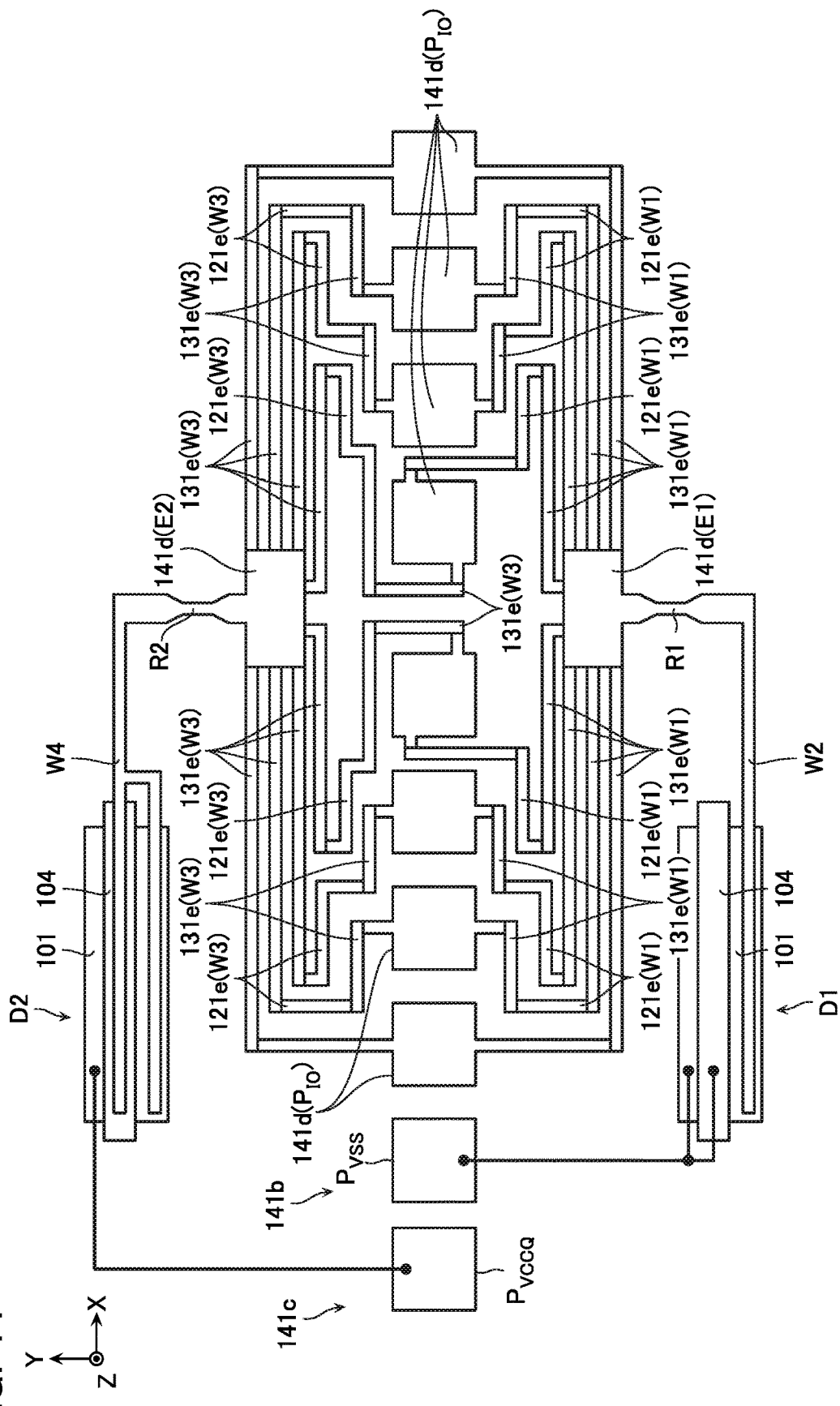
FIG. 14 is a schematic plan view of the same semiconductor device.
Figure 15:
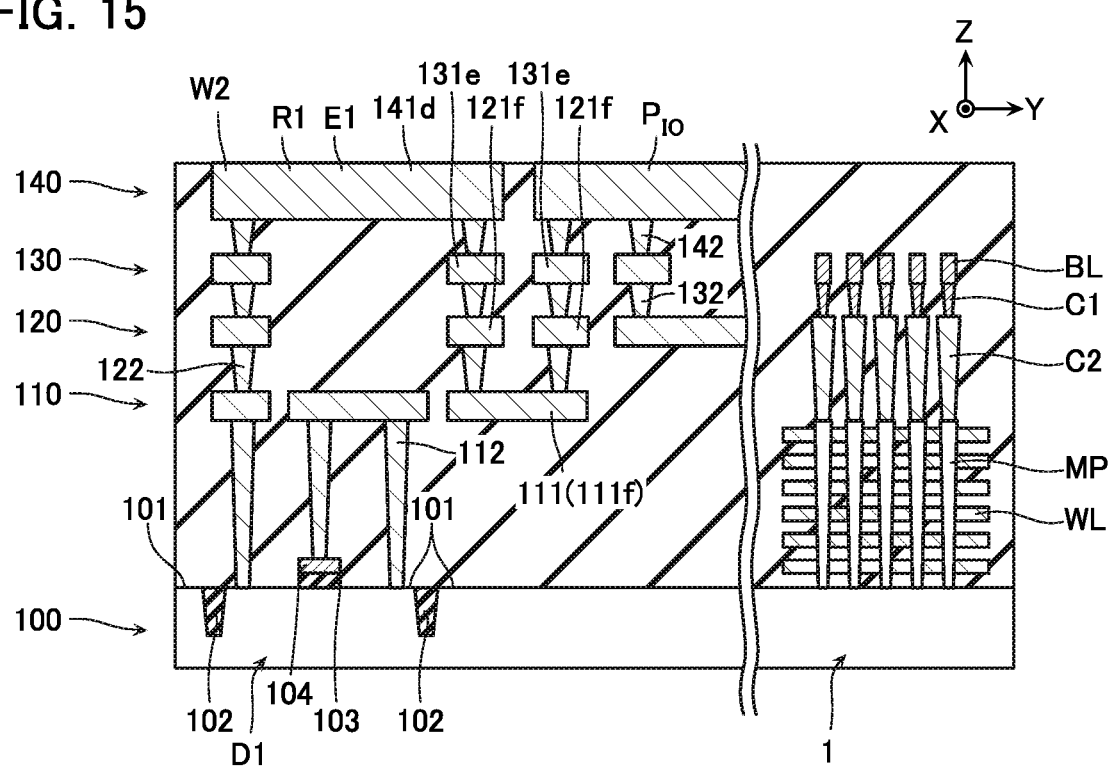
FIG. 15 is a schematic sectional view of a semiconductor device according to a fourth configuration example.
Figure 16:
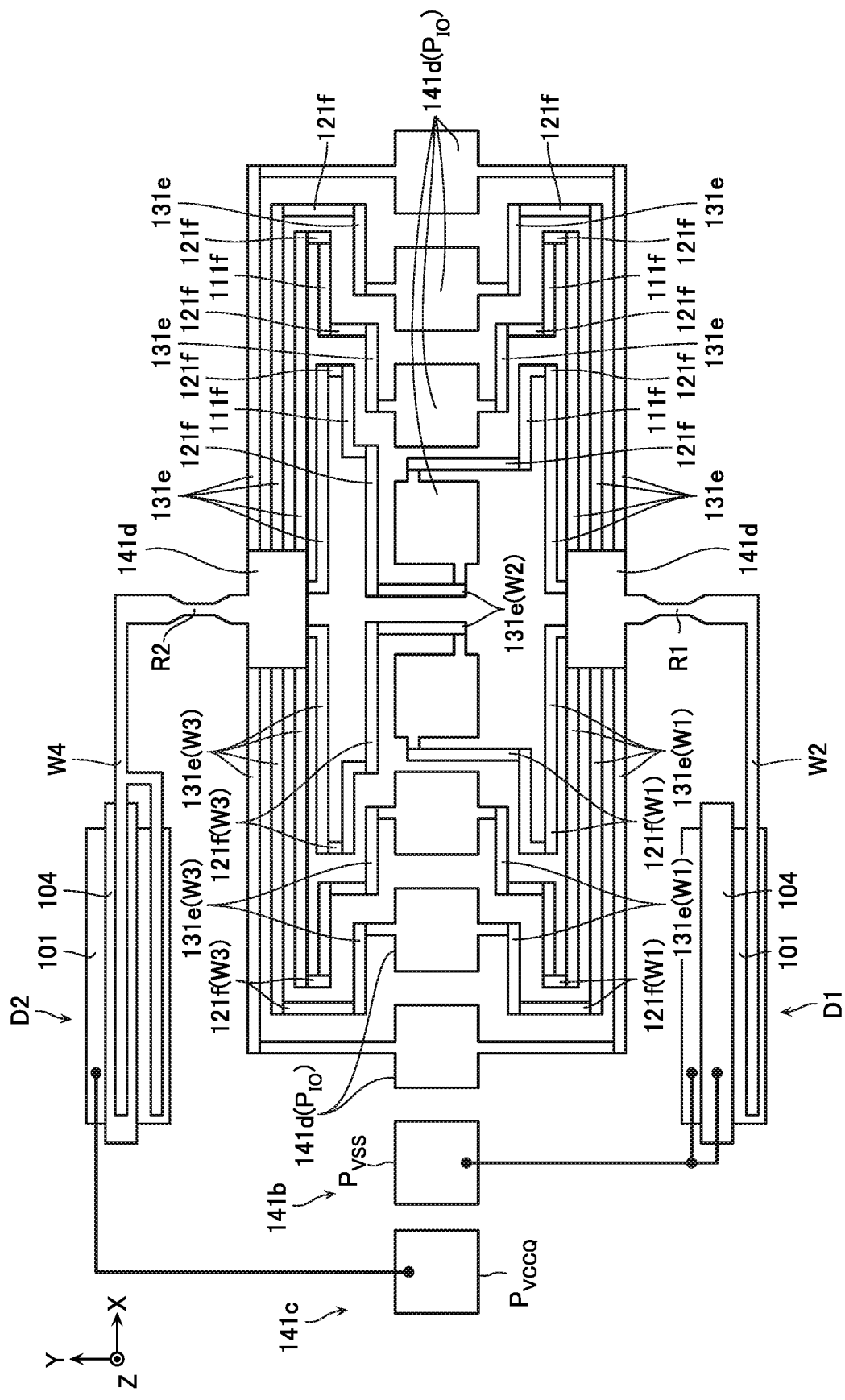
FIG. 16 is a schematic plan view of the same semiconductor device.

For example, FIG. 11 and FIG. 12 show an example in which a wiring member 131d in the wiring layer 130, a wiring member 141d in the wiring layer 140, and a plurality of contact members connected thereto function as the wires W1 and W3. In addition, FIG. 13 and FIG. 14 show an example in which a wiring member 121e in the wiring layer 120, a wiring member 131e in the wiring layer 130, a wiring member 141d in the wiring layer 140, and a plurality of contact members connected thereto function as the wires W1 and W3. In addition, FIG. 15 and FIG. 16 show an example in which a wiring member 111f in the wiring layer 110, a wiring member 121f in the wiring layer 120, a wiring member 131e in the wiring layer 130, a wiring member 141d in the wiring layer 140, and a plurality of contact members connected thereto function as the wires W1 and W3.

In addition, in the above described configuration examples, the wires W1 and W3 have had substantially the same structure, and have been formed of wiring members and the like which are included in the same wiring layer.

However, wiring members and the like which function as the wires W1 and W3 may be formed of wiring members and the like which are included in different wiring layers.

Figure 17:
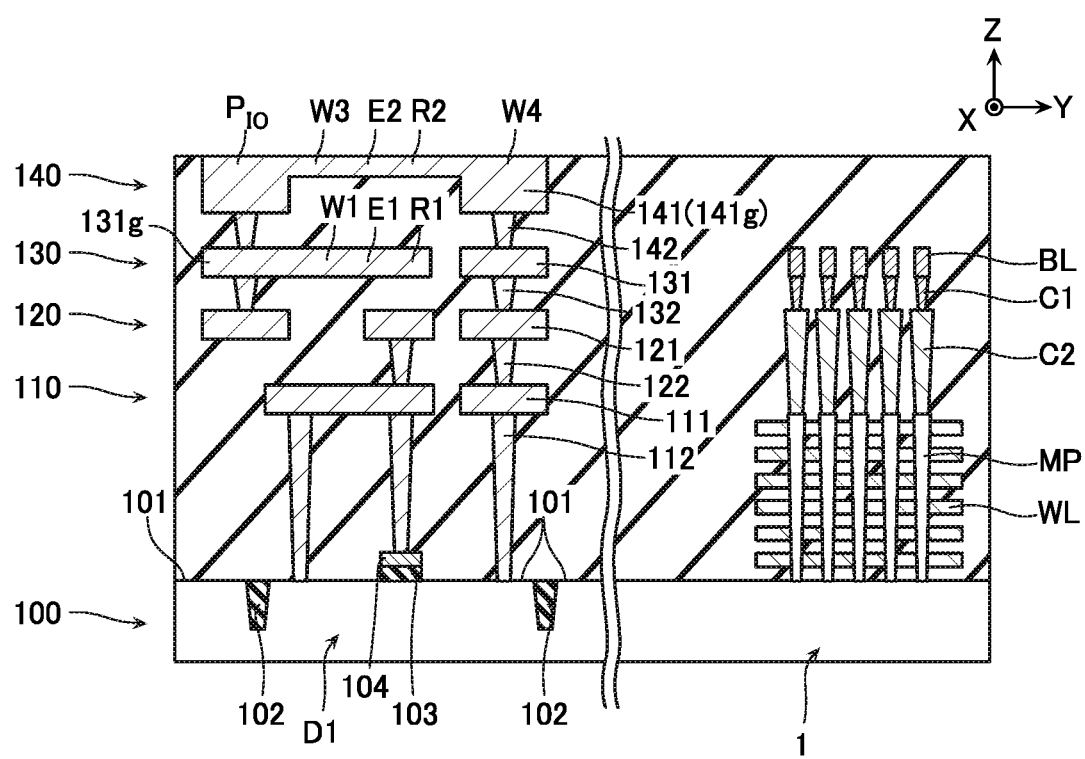
FIG. 17 is a schematic sectional view of a semiconductor device according to a fifth configuration example.
Figure 18:
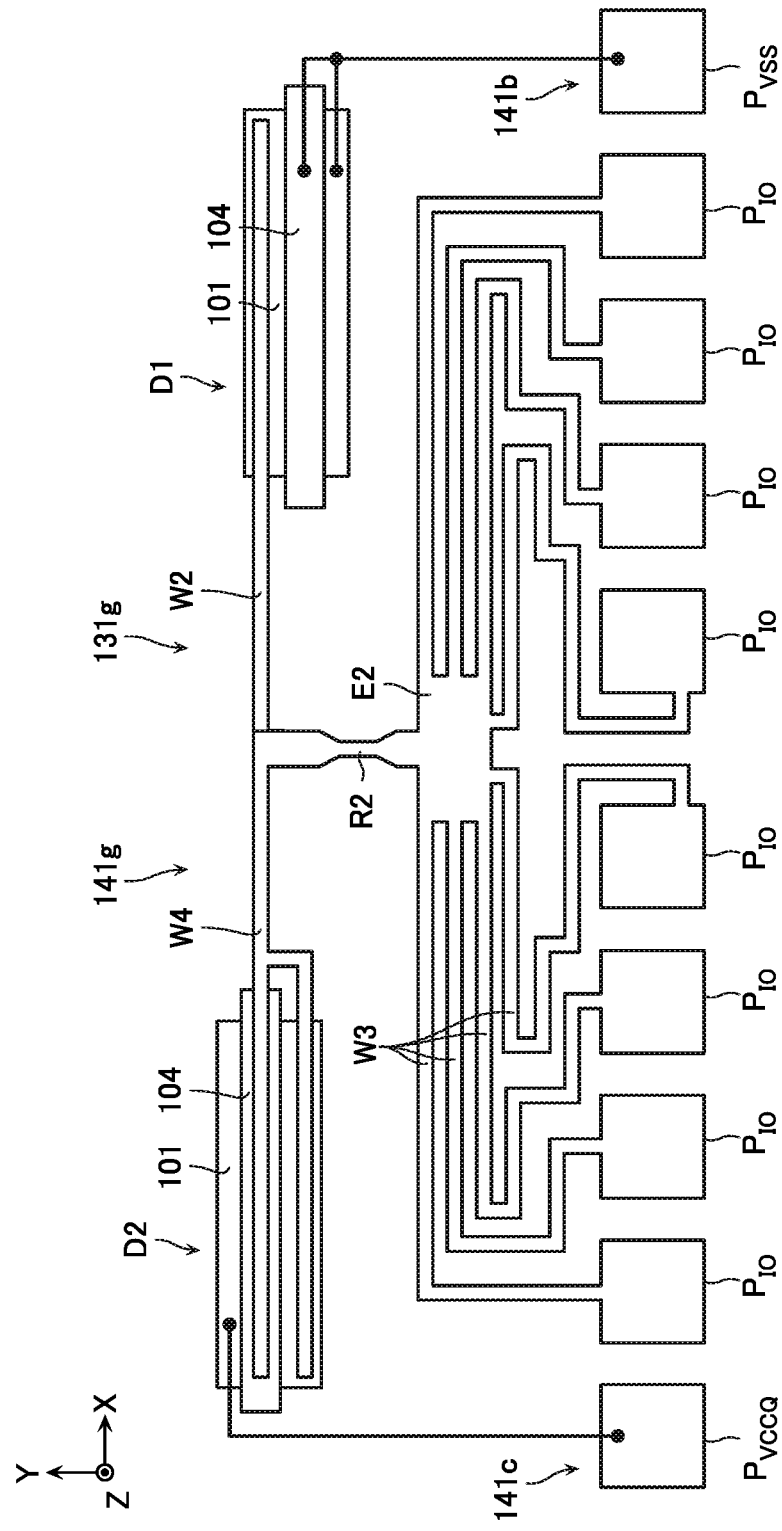
FIG. 18 is a schematic plan view of the same semiconductor device.

For example, FIG. 17 and FIG. 18 show an example in which a wiring member 141g in the wiring layer 140 functions as the pad electrodes $P_{IO}$, the wires W3, the common electrode E2, the resistance portion R2, and a part of the wire W4; and in which a wiring member 131g in the wiring layer 130 functions as the wires W1, the common electrode E1, the resistance portion R1, and a part of the wire W2. Incidentally, the wiring member 141g and the wiring member 131g have substantially the same shape in an XY plane. According to such a configuration, the pad electrodes $P_{IO}$, $P_{VSS}$ and $P_{VCCQ}$ can be arranged to approach an end in the Y direction of the memory chip MC. Therefore, the memory chips MC can be stacked without being largely displaced in the Y direction (refer to FIG. 2). In addition, an area of the protective circuit can be reduced.

In addition, in the above described configuration examples, wiring members in the wiring layers 110, 120, 130 and 140 function as the resistance portions R1 and R2. However, contact members may function as the resistance portions R1 and R2 instead of the wiring members.

Figure 19:
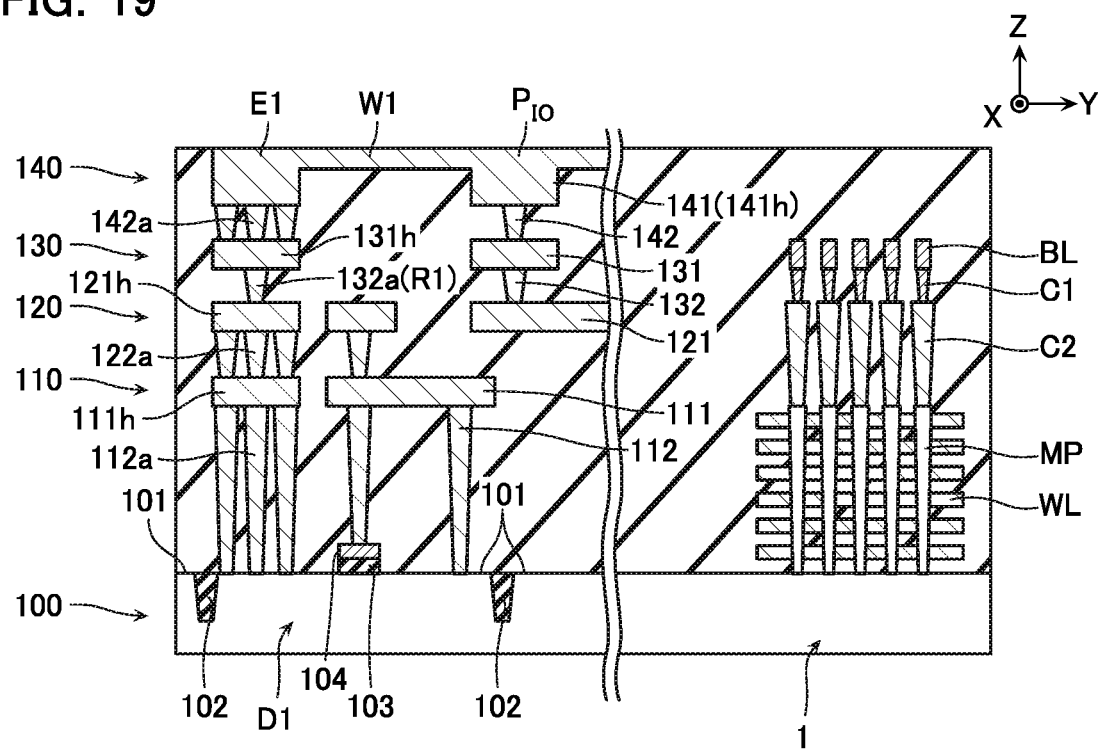
FIG. 19 is a schematic sectional view of a semiconductor device according to a sixth configuration example.
Figure 20:
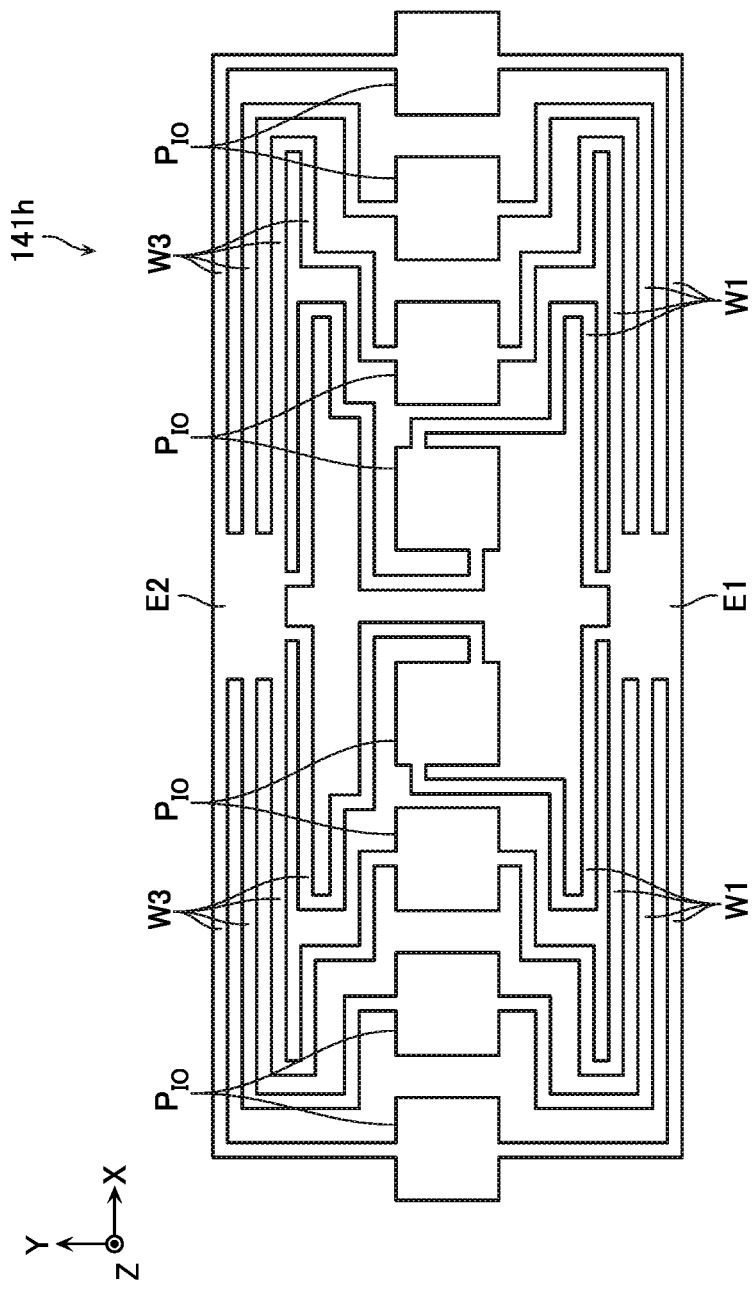
FIG. 20 is a schematic plan view of the same semiconductor device.

For example, FIG. 19 shows an example in which a contact member 132a functions as the resistance portion R1. In the example of FIG. 19, a wiring member 141h is connected to a wiring member 131h via a plurality of contact members 142a. A part of the wiring member 141h, the plurality of contact members 142a and the wiring member 131h function as a part of the common electrode E1. In addition, in the example of FIG. 19, the wiring member 131h is connected to a wiring member 121h via one contact member 132a. The contact member 132a functions as the resistance portion R1. In addition, in the example of FIG. 19, the wiring member 121h is connected to a wiring member 111h via a plurality of contact members 122a, and the wiring member 111h is connected to the protective element D1 (active area 101) via a plurality of contact members 112a. The wiring members 121h and 111h and the contact members 122a and 112a function as the wire W2. According to such a configuration, as illustrated in FIG. 20, there is no need to provide the resistance portions R1 and R2 and the wires W2 and W4 in the wiring member 141h, and accordingly the area of the protective circuit can be reduced.

In addition, in the above described configuration examples, the parts which function as the pad electrodes $P_{IO}$ in the wiring layer 140 have been arranged to form a line in the X direction. However, the parts which function as the pad electrodes may be arranged to form two lines or a plurality of lines more than two lines, or arranged in another pattern.

Figure 21:
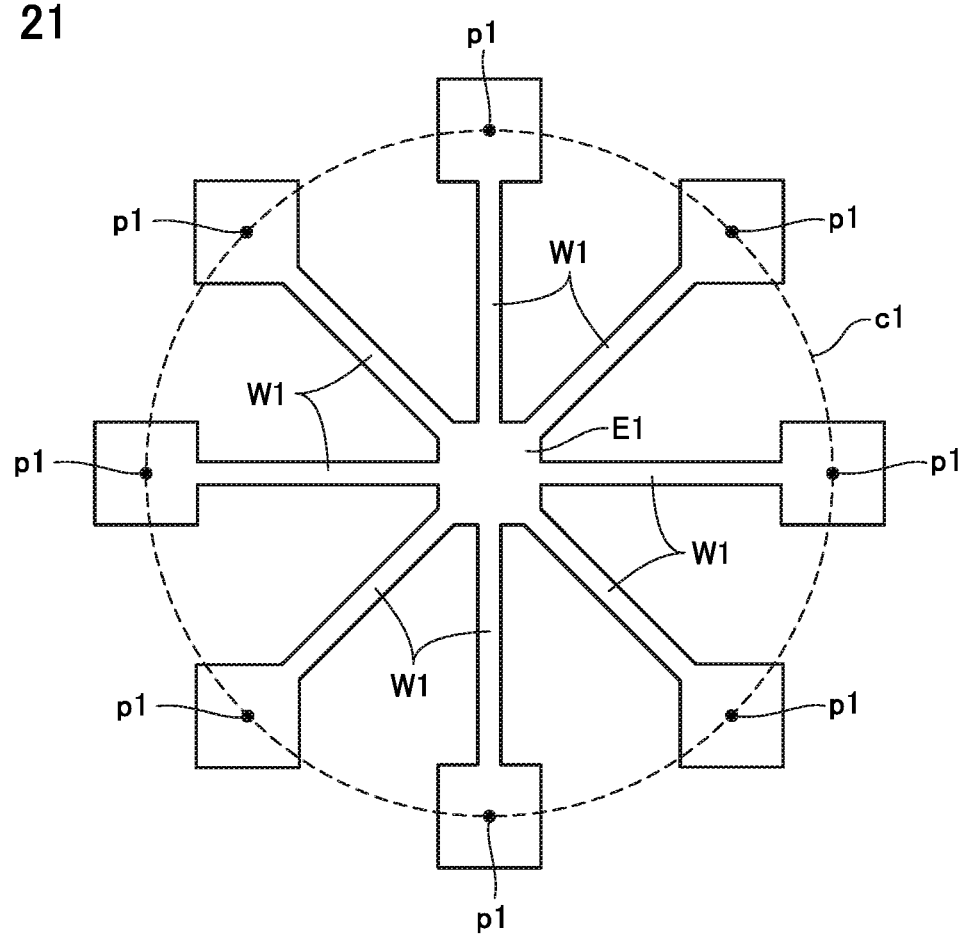
FIG. 21 is a schematic plan view of a semiconductor device according to a seventh configuration example.

For example, FIG. 21 shows an example in which the plurality of pad electrodes $P_{IO}$ are arranged along a circle c1 at equal distances. The common electrode E1 is arranged at a center of the circle c1, and the wires W1 that connect the pad electrodes to the common electrode extend in a radial pattern. Incidentally, points p1 in the figure show centers of the pad electrodes $P_{IO}$, respectively.

In addition, in the above described configuration examples, the wiring widths and wiring lengths of the wiring members which function as the wires W1 and W2 are substantially the same, and thereby the impedances of the wires W1 and W2 have become substantially same. However, it is also acceptable to set ratios of the wiring widths and wiring lengths of the wiring members which function, for example, as the wires W1 and W2 to be substantially the same and thereby set the impedances of the wires W1 and W2 to be substantially the same.

Figure 22:
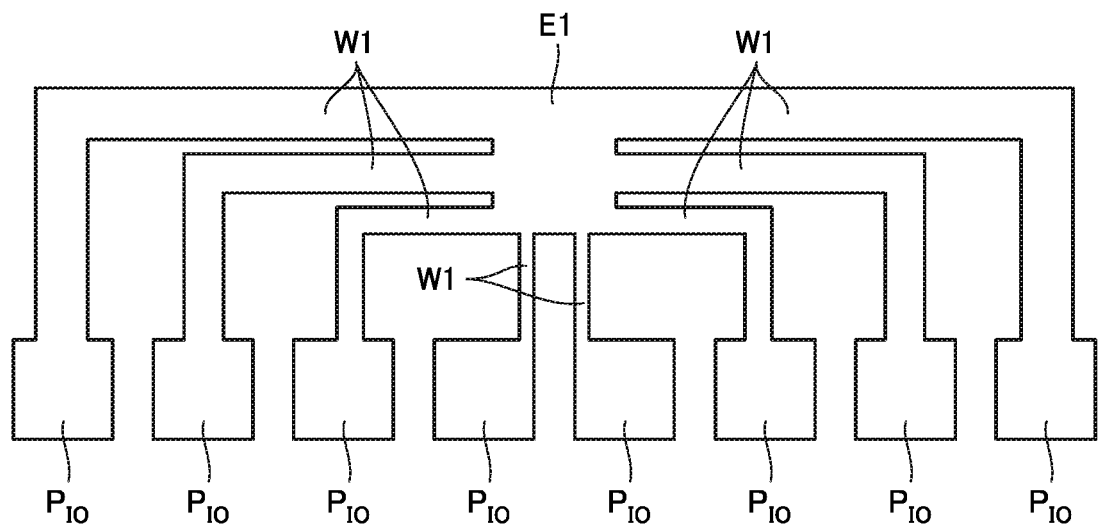
FIG. 22 is a schematic plan view of a semiconductor device according to an eighth configuration example.

For example, FIG. 22 shows an example in which the farther from the common electrode E1 or E2 a pad electrode $P_{IO}$ is to which a wire W1 is connected, the larger wiring width the wire W1 has.

Second Embodiment

Figure 23:
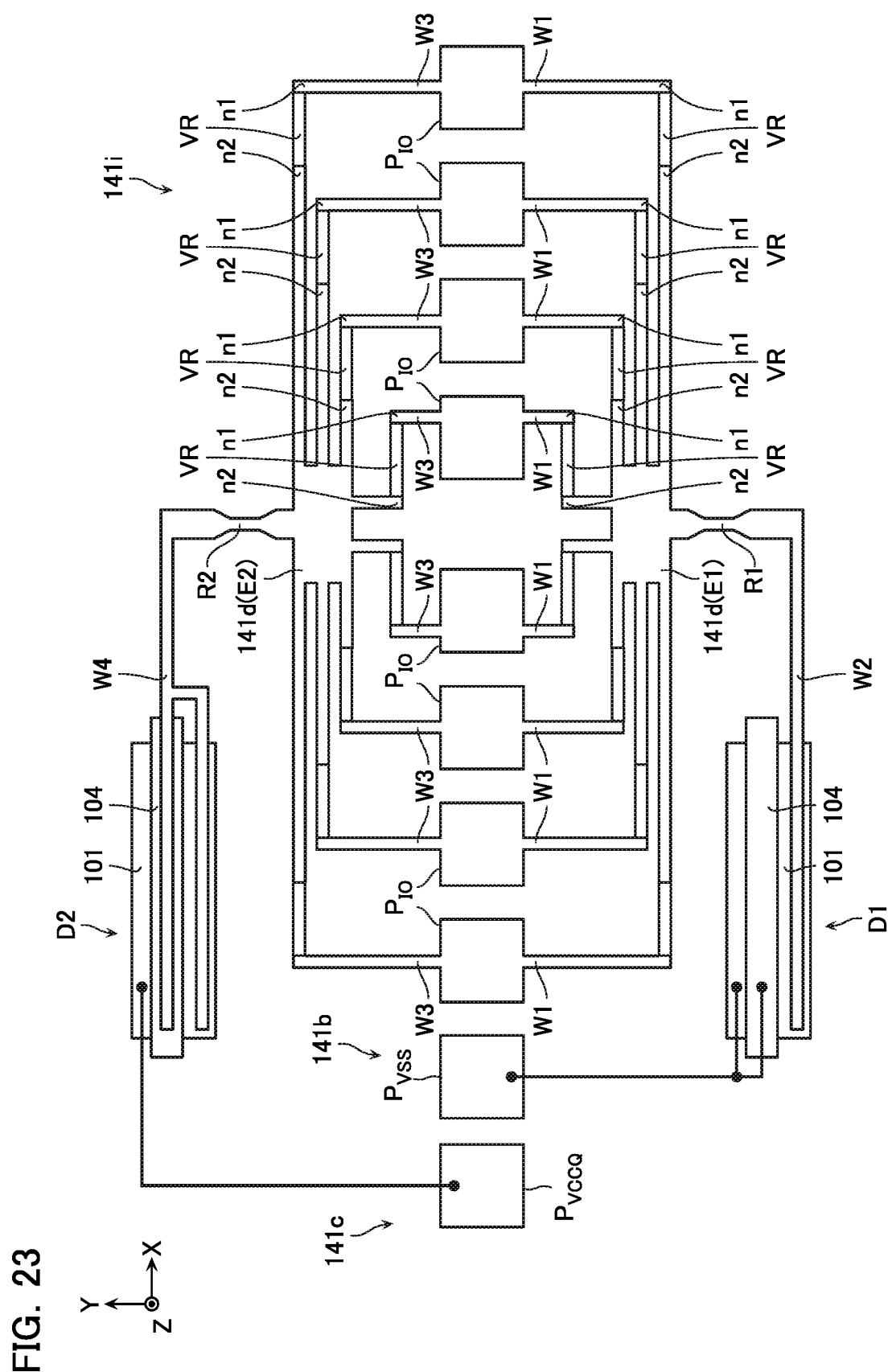
FIG. 23 is a schematic plan view of a semiconductor device according to a second embodiment.

Next, a semiconductor device according to a second embodiment will be described with reference to FIG. 23 and FIG. 24.

The semiconductor device according to the second embodiment is configured basically similarly to the semiconductor device according to the first embodiment. However, in the second embodiment, variable resistance elements VR are provided between the plurality of pad electrodes $P_{IO}$ and the common electrode E1 or E2, respectively.

That is, in the first embodiment, the impedances of the wires W1 and W2 are set to be substantially the same, by use of wiring resistances of the members in the wiring layers 110, 120, 130 and 140, and the like. However, in the second embodiment, the impedances between the pad electrodes $P_{IO}$ and the common electrode E1 or E2 are set to be substantially the same, by the adjustment of the impedances of the variable resistance elements VR.

Figure 24:
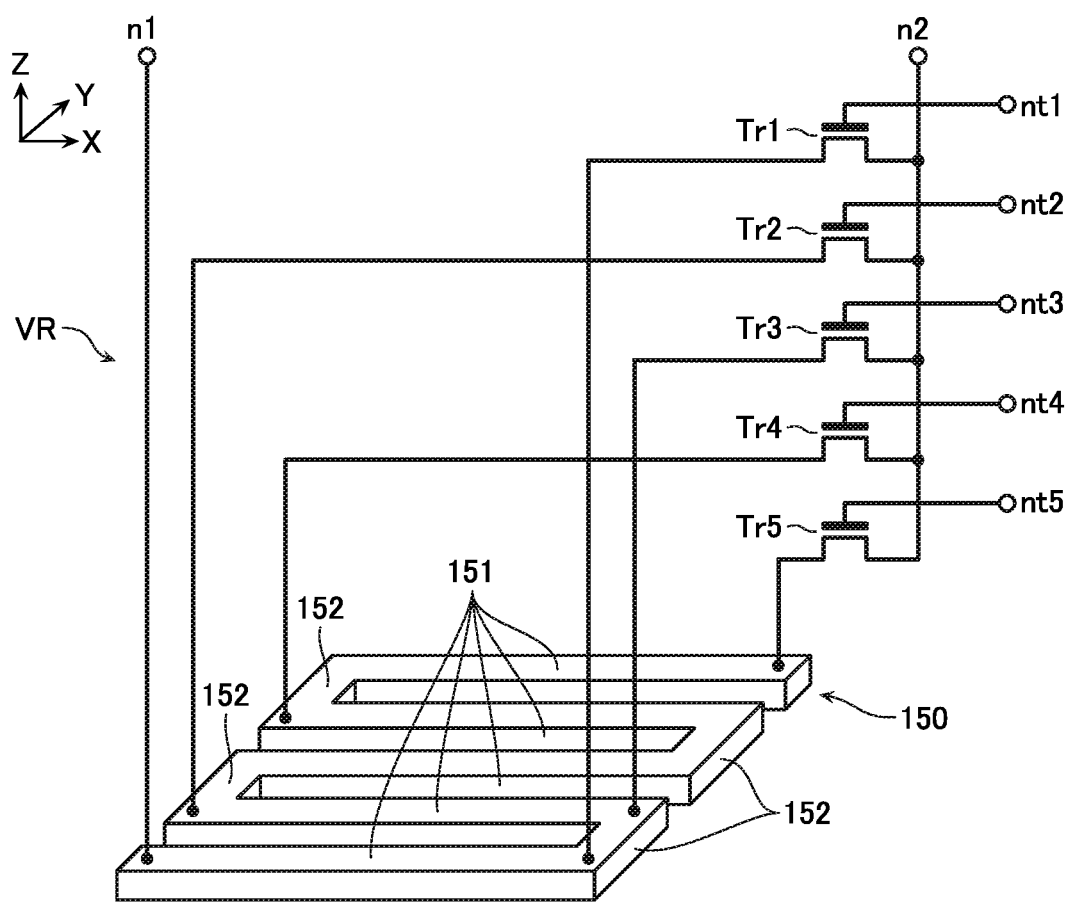
FIG. 24 is a schematic view showing a configuration of a variable resistance element VR.

FIG. 24 is a schematic view showing a configuration example of the variable resistance element VR. The variable resistance element VR includes: an input terminal n1; a wiring member 150 which is connected to the input terminal n1; a plurality of transistors Tr1 to Tr5 which are connected to the wiring member 150; and an output terminal n2 that is connected to the plurality of transistors Tr1 to Tr5 in common.

The wiring member 150 includes: a plurality of straight portions 151 which are provided in the Y direction and extend in the X direction; and connection portions 152 which are connected to the straight portions. The plurality of straight portions 151 are connected in series via the plurality of connection portions 152. Incidentally, the wiring member 150 may also be one of the wiring members that are provided in the wiring layers 110, 120, 130 and 140. In addition, a part of the plurality of gate electrodes 104 may be used as the wiring member 150.

The transistor Tr1 is connected to the input terminal n1 via one straight portion 151. The transistor Tr2 is connected to the input terminal n1 via two straight portions 151. Similarly hereinafter, the transistors Tr3 to Tr5 are connected to the input terminal n1 via three to five straight portions 151, respectively.

Other Embodiments

The first and second embodiments have been shown as examples, and the specific configuration can be appropriately varied.

For example, in the first embodiment, the memory cell array 1 has been illustrated as the internal circuit of the semiconductor device, as shown in FIG. 1 and the like. However, the internal circuit may be another configuration, for example, such as an arithmetic processing circuit. In addition, the configuration of the memory cell array can also be appropriately varied. For example, the memory cell array 1 according to the first embodiment includes a three-dimensional type of NAND flash memory. However, the memory cell array may include a two-dimensional type NAND flash memory, or may include a NOR flash memory. In addition, the memory cell array may include a memory other than the flash memory, such as DRAM (Dynamic Random Access Memory), ReRAM (Resistive Random Access Memory), MRAM (Magnetic Random Access Memory) and PCRAM (Phase Change Random Access Memory).

In addition, in the first embodiment, the bonding wire B connects the chips to each other, as shown in FIG. 2 and FIG. 3. However, for example, a so-called through silicon via (TSV) electrode may connect the chips to each other.

In addition, in the first embodiment, the resistance portion R1 is provided between the common electrode E1 and the wire W2, and the protective element D1 has been provided between the wire W2 and the pad electrode $P_{VSS}$, as illustrated in FIG. 4. In addition, the resistance portion R2 has been provided between the common electrode E2 and the wire W4, and the protective element D2 has been provided between the wire W4 and the pad electrode $P_{VCCQ}$. However, the protective element D1 may be provided between the common electrode E1 and the wire W2, and the resistance portion R1 may be provided between the wire W2 and the pad electrode $P_{VSS}$. Similarly, the protective element D2 may be provided between the common electrode E2 and the wire W4, and the resistance portion R2 may be provided between the wire W4 and the pad electrode $P_{VCCQ}$.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate;
a plurality of first pad electrodes provided above the semiconductor substrate;
a plurality of first wires electrically connected to the plurality of first pad electrodes respectively;
a first electrode commonly connected to the plurality of first wires;
a second pad electrode provided above the semiconductor substrate;
a first resistance portion and a first protective element that are connected in series between the first electrode and the second pad electrode;
a plurality of second wires electrically connected to the plurality of first pad electrodes respectively;
a second electrode commonly connected to the plurality of second wires;
a third pad electrode provided above the semiconductor substrate; and
a second resistance portion and a second protective element that are connected in series between the second electrode and the third pad electrode.

2. The semiconductor device according to claim 1, wherein impedances of the plurality of first wires are substantially the same.

3. The semiconductor device according to claim 1, wherein
impedances of the plurality of first wires are substantially the same, and
impedances of the plurality of second wires are substantially the same.

4. The semiconductor device according to claim 1, comprising one or more wiring layers, wherein
the one or more wiring layers comprise wiring members and contact members which function as at least one of the plurality of first pad electrodes, the plurality of first wires, the first electrode, the second pad electrode, the first resistance portion and the first protective element.

5. The semiconductor device according to claim 1, comprising one or more wiring layers, wherein
the one or more wiring layers comprise wiring members and contact members which function as at least one of the plurality of first pad electrodes, the plurality of first wires, the first electrode, the plurality of second wires, the second electrode, the second pad electrode, the third pad electrode, the first resistance portion, the second resistance portion, the first protective element and the second protective element.

6. The semiconductor device according to claim 1, wherein
the semiconductor substrate comprises an active area, and
the first protective element comprises:
a part of the active area of the semiconductor substrate;
a first insulating film provided on the part of the active area; and
a first lower electrode provided on the first insulating film.

7. The semiconductor device according to claim 1, wherein
the semiconductor substrate comprises an active area,
the first protective element comprises:
a first part of the active area of the semiconductor substrate;
a first insulating film provided on the first part of the active area; and
a first lower electrode provided on the first insulating film, and
the second protective element comprises:
a second part of the active area of the semiconductor substrate;
a second insulating film provided on the second part of the active area; and
a second lower electrode provided on the second insulating film.

8. The semiconductor device according to claim 1, wherein
the plurality of first pad electrodes and the second pad electrode are arranged in a first direction, and
at least one of the plurality of first wires comprises:
a plurality of first extending portions extending in the first direction; and
a plurality of second extending portions extending in a second direction which intersects with the first direction.

9. The semiconductor device according to claim 1, wherein
the plurality of first pad electrodes, the second pad electrode and the third pad electrode are arranged in a first direction,
at least one of the plurality of first wires comprises:
a plurality of first extending portions extending in the first direction; and
a plurality of second extending portions extending in a second direction which intersects with the first direction, and at least one of the plurality of second wires comprises:
a plurality of third extending portions extending in the first direction; and
a plurality of fourth extending portions extending in the second direction.

10. The semiconductor device according to claim 1, wherein
the first resistance portion comprises:
a first portion connected to the first electrode;
a second portion connected to the first portion; and
a third portion connected to the second portion,
a wiring width of the second portion is smaller than wiring widths of each of the first portion and the third portion,
the second resistance portion comprises:
a fourth portion connected to the second electrode;
a fifth portion connected to the fourth portion; and
a sixth portion connected to the fifth portion, and
a wiring width of the fifth portion is smaller than wiring widths of each of the fourth portion and the sixth portion.

11. The semiconductor device according to claim 1, wherein data of a plurality of bits are output in parallel via the plurality of first pad electrodes.

12. The semiconductor device according to claim 1, being configured such that an electric power can be supplied to the semiconductor device via the second pad electrode.

13. The semiconductor device according to claim 1, wherein
the plurality of first wires comprises:
an inter-layer wiring portion extending in a thickness direction of the semiconductor substrate; and
an in-layer wiring portion extending in a direction parallel with a surface of the semiconductor substrate.

14. The semiconductor device according to claim 1, wherein
the plurality of first wires and the plurality of second wires comprises:
an inter-layer wiring portion extending in a thickness direction of the semiconductor substrate; and
an in-layer wiring portion extending in a direction parallel with a surface of the semiconductor substrate.

15. A semiconductor device, comprising:
a semiconductor substrate;
a plurality of first pad electrodes provided above the semiconductor substrate;
a plurality of first wires electrically connected to the plurality of first pad electrodes respectively;
a first electrode commonly connected to the plurality of first wires;
a second pad electrode provided above the semiconductor substrate; and
a first resistance portion and a first protective element that are connected in series between the first electrode and the second pad electrode, wherein
the first resistance portion comprises:
a first portion connected to the first electrode;
a second portion connected to the first portion; and
a third portion connected to the second portion, and
a wiring width of the second portion is smaller than wiring widths of each of the first portion and the third portion.

16. The semiconductor device according to claim 15, wherein impedances of the plurality of first wires are substantially the same.

17. The semiconductor device according to claim 15, comprising one or more wiring layers, wherein
the one or more wiring layers comprise wiring members and contact members which function as at least one of the plurality of first pad electrodes, the plurality of first wires, the first electrode, the second pad electrode, the first resistance portion and the first protective element.

18. The semiconductor device according to claim 15, wherein
the semiconductor substrate comprises an active area, and
the first protective element comprises:
a part of the active area of the semiconductor substrate;
a first insulating film provided on the part of the active area; and
a first lower electrode provided on the first insulating film.

19. The semiconductor device according to claim 15, wherein
the plurality of first pad electrodes and the second pad electrode are arranged in a first direction, and
at least one of the plurality of first wires comprises:
a plurality of first extending portions extending in the first direction; and
a plurality of second extending portions extending in a second direction which intersects with the first direction.

20. The semiconductor device according to claim 15, wherein
data of a plurality of bits are output in parallel via the plurality of first pad electrodes.

* * * * *